(12) United States Patent
Renner et al.

(10) Patent No.: US 6,330,034 B1
(45) Date of Patent: Dec. 11, 2001

(54) COLOR PHASE-LOCKED LOOP FOR VIDEO DECODER

(75) Inventors: Karl Renner, Dallas; Peter Chang, Hurst, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/183,243

(22) Filed: Oct. 30, 1998

Related U.S. Application Data
(60) Provisional application No. 60/063,772, filed on Oct. 31, 1997, and provisional application No. 60/068,548, filed on Dec. 23, 1997.

(51) Int. Cl.[7] .................. H04N 9/45; H04N 3/24; H03L 7/00
(52) U.S. Cl. .................. 348/536; 348/536; 348/505; 348/507; 348/636; 348/639; 348/508
(58) Field of Search .................. 348/505, 507, 348/508, 537, 539, 638, 639, 640, 641, 536, 735

(56) References Cited

U.S. PATENT DOCUMENTS

| | | | |
|---|---|---|---|
| 4,686,560 | * | 8/1987 | Balaban et al. ............ 358/19 |
| 4,694,326 | * | 9/1987 | Demmer ..................... 358/19 |
| 4,694,327 | * | 9/1987 | Demmer et al. ............ 358/19 |
| 4,700,217 | * | 10/1987 | Balaban et al. ............ 358/23 |
| 4,703,340 | * | 10/1987 | Balaban et al. ............ 358/19 |
| 4,736,237 | * | 4/1988 | Fling et al. ................ 358/19 |
| 4,802,009 | * | 1/1989 | Hartmeier .................. 358/158 |
| 4,864,399 | * | 9/1989 | Romesburg et al. ........ 358/148 |
| 5,067,138 | * | 11/1991 | Van Rens et al. .......... 375/81 |
| 5,337,335 | * | 8/1994 | Cloetens et al. ........... 375/120 |
| 5,459,524 | * | 10/1995 | Cooper ...................... 348/507 |
| 5,459,766 | * | 10/1995 | Huizer et al. .............. 375/376 |
| 5,774,512 | * | 6/1998 | Bhatt ......................... 375/376 |
| 6,064,446 | * | 5/2000 | Wissing et al. ............ 348/639 |

* cited by examiner

Primary Examiner—Reinhard J. Eisenzopf
Assistant Examiner—Paulos Natnael
(74) Attorney, Agent, or Firm—W. James Brady, III; Frederick J. Telecky, Jr.

(57) ABSTRACT

A microprocessor controlled color phase locked loop is provided which provides flexibility and adaptability for different television standards and sampling rates. Color burst phase error and color burst amplitude information are stored in data registers located at the output of the phase locked loop's low pass filter rather than at the output of the color demodulator.

1 Claim, 10 Drawing Sheets

COLOR PHASE-LOCKED LOOP FOR VIDEO DECODER

This application claims benefit to provisional application Ser. No. 60/063,772, Oct. 31, 1997 and claims benefit of Ser. No. 60/068,548, Dec. 23, 1997.

BACKGROUND OF THE INVENTION

Composite video is a communications signal which contains color video information (which includes the chrominance signal conveyed by means of a subcarrier) as well as timing information for the accurate reproduction of the active video (e.g. reproduction of the picture information including its correct colors). This signal is essentially a video stream that combines, as a one signal, all of the elements required for displaying an image. The timing information is conveyed through the transmission of synchronization signals. A synchronization signal is commonly referred to as sync. In conjunction with a receiver which displays pixel information according to the video picture transmitted, an electric beam scans the receiver's display according to the horizontal sync signal followed by a horizontal blanking interval during which time the beam is shut off so that it can spot retrace horizontally across the display without being observed. Once the display has been scanned from top to bottom, the vertical sync signal determines when the beam is returned to the top of the display during the vertical blanking interval during which time the beam is shut off so that it can spot retrace vertically across the display without being observed. A composite video signal generally includes active video, horizontal sync, horizontal blanking, vertical sync, vertical blanking, and color burst. The color burst is that portion of the video waveform that sits between the breezeway (the portion of the video waveform between the rising edge of the horizontal sync and the start of the color burst) and the start of the active video. The color burst allows the color decoder to decode the color information contained in a line of active video. In a receiver or video decoder, the color phase locked-loop maintains lock of the local color oscillator with the color burst of the composite video input signal.

Conventional horizontal phase-locked loops for video decoders serve the purpose of locking the sampling clock, for clocking digital pixel information into the phase-locked loop, to the falling edge of the incoming horizontal sync of composite video information. This lock is required to generate a stable picture in the horizontal direction and position signals which identify the sync tip, back porch, and the color burst of the composite video. The analog video information enters an analog-to-digital converter which outputs digital pixel information. A pixel counter counts video information corresponding to pixels in what can be considered a horizontal scan line across a display monitor screen such as a cathode ray tube. The pixel counter starts with a count of zero and counts to a terminal count and then falls back to zero. The phase-locked loop employs two modes of lock; a coarse lock and a fine lock. In the coarse lock mode the incoming horizontal sync pulse which is usually present during the blanking interval of each line associated with the video signal (for the purpose of being able to synchronize the scanning of the monitor with the scanning of the original image), is detected by an analog circuit. Based on the decode of the pixel counter, a coarse gate filter window (meaning a relatively wide time window in comparison with the narrow time window associated with the fine window discussed below) is enabled around the time the horizontal sync pulse is expected. If the sync does not occur within the gate window for a time corresponding to several consecutive video lines, then either the pixel counter is reset or a correction is made to the clock frequency of the video decoder system in order to move the window to the sync pulse. When the sync pulse falls within the fine lock window, then the fine lock mode is enabled. A fine gate filter window is employed by the fine lock mode which enables a phase detector which calculates a phase error based upon the position of the edge of the sync pulse within a narrow window known as the fine lock window. This phase error is then filtered by a loop filter whose output is fed to a discrete time oscillator which adjusts the clock frequency to move the sync pulse so that its edge is centered in the fine window, thereby minimizing the phase error. Prior art horizontal phase-locked loop schemes are generally implemented according to analog hardware, digital hardware or a combination of analog and digital hardware. A major drawback of this type of implementation lies in the inconvenience of changing parameters to adapt to a particular video scheme, e.g. NTSC, PAL, NPAL, MPAL, etc.

The color phase lock loop is normally controlled by generating the phase error between the color burst input and the locally generated color frequency. The phase error is computed during the color burst interval by accumulating the product of the color burst input pixels and the cosine of the local color oscillator $\cos w_{sc} t$. The phase error is then filtered and added to a nominal color DTO increment value and then written to the color DTO. This occurs once per scan line. The phase error may also be accumulated in a register such that any frequency offset may be detected and added to the color DTO increment. This technique works fine if the pixel clock frequency is stable. However, should the pixel clock frequency vary (as it can with VCR (video cassette recorder) inputs), problems can arise in efforts to accurately reproduce color content on a display. A microprocessor based system is needed in order provide a highly adaptable and improved horizontal phase-locked loop as well as an improved color phase-locked loop.

BRIEF DESCRIPTION OF THE DRAWINGS

Reference numerals in the drawings have been carried forward.

DETAILED DESCRIPTION OF THE INVENTION

The invention concerns a video decoder including a color phase lock loop which maintains lock of the local color oscillator with the color burst of the composite video input signal. The video decoder implements a digital version of the color oscillator called a discrete time oscillator (DTO). The frequency and phase of the color DTO is controlled by an increment value that is written to it by a microprocessor. The color DTO is clocked by the pixel sampling clock. The color phase lock loop must be able to lock to color burst frequencies which deviate within a narrow range from the nominal color burst frequency (e.g. 3.58 MHz for NTSC). Wide deviations can occur in non standard video such as TV games. The VCR is another source of nonstandard video. Due to head switching transients the horizontal sync frequency can jump by as much as 16 μsec during the vertical sync interval. The horizontal phase lock loop must make coarse corrections in its timing in order to maintain lock to this input. Since the color DTO is clocked by the pixel clock, corresponding coarse corrections must be made to it such that color lock is not lost.

Figure 1:
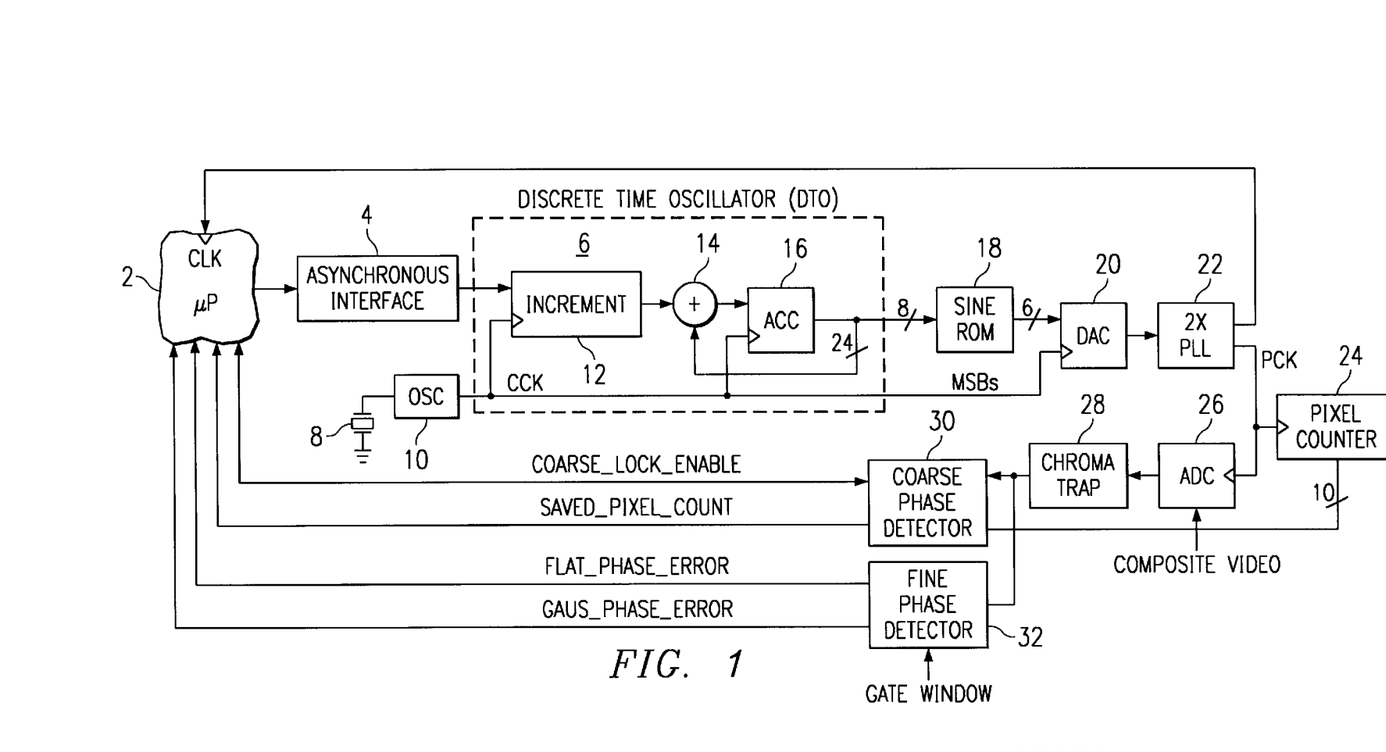
FIG. 1 illustrates a block diagram of the system incorporating the invention's phase-locked loop.

The phase of the pixel clock is locked to the pulse to the phase of the horizontal sync pulse by a horizontal phase-locked loop. In a preferred embodiment, the horizontal phase-locked loop as well as the color phase-locked loop are implemented on an integrated circuit as part of a video decoder integrated circuit chip. FIG. 1 illustrates a block diagram of the system incorporating the horizontal phase-locked loop. On a video line by video line basis, microprocessor 2 reads parameters from the coarse and fine lock phase detectors which generate a phase error based on the position of the horizontal sync pulse relative to the locked position. Discrete time oscillator (DTO) 6 is clocked using a crystal 8 (made preferably of quartz or other suitable material) in conjunction with oscillator 10. DTO 6 is incremented by block 12 which outputs a number to a summer 14 which sums the incremented number with the output of accumulator 16. A limit is placed on the increment number from block 12 so as to limit the clock frequency to microprocessor 2. This limit ensures that the microprocessor throughput is not stressed. Accumulator 16 maintains the count of DTO 6 on an 24 bit parallel basis as a result of this feedback configuration. The value in accumulator 16 is incremented until an upper limit or modulus is reached. This modulus is determined by the number of register bits in the accumulator which is $2^n$. DTO 6's maximum output frequency is restricted to about less than half of oscillator 10's clock frequency so that the digital-to-analog converter 20, which performs digital-to-analog conversions at the clock rate of oscillator 10, will not have to convert a digital input with a frequency of greater than half the clock sampling rate. This is consistent with the Nyquist criterion and it ensures that at least two samples per output period are generated according to the Nyquist criterion. The 8 most significant bit values (MSBs) from the horizontal DTO are received by sine ROM (read only memory) 18 and are converted to digital values corresponding to points on a sinusoidal wave, such as sine wave, via a look-up table stored in sine ROM 18. The sine wave values from the 6-bit output of sine ROM 18 are input to DAC 20. The analog signal from DAC 20 is input to analog phase-locked loop (2×PLL) 22. This conversion from the horizontal DTO sawtooth waveform to a sine wave provides a waveform which is easier to lock on to for analog phase-locked loop 22 than would be the case without the conversion since the converted sine wave has less frequency content than the square wave. As shown, loop 22 also provides the system clock to microprocessor 2.

Figure 2:
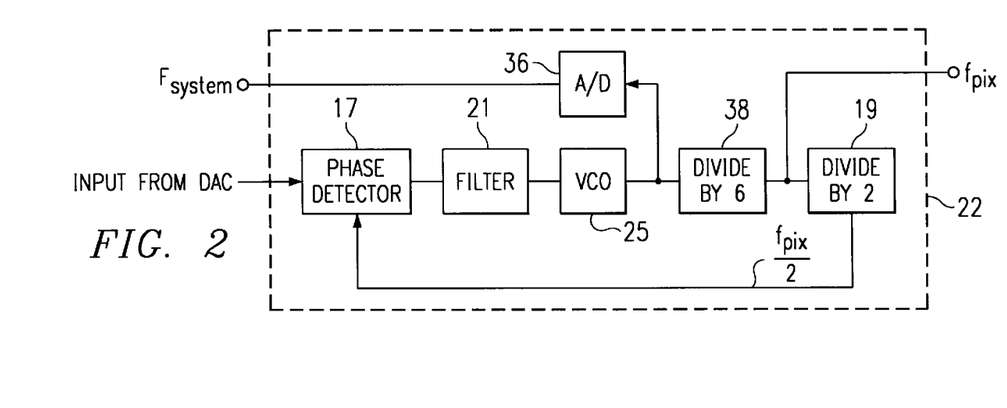
FIG. 2 is a block diagram which illustrates analog phase-locked loop.

FIG. 2 is a block diagram which illustrates analog phase-locked loop 22. The analog input signal from DAC 20 is received by phase detector 17 which also receives a signal from divide by 2 frequency divider 19. This phase detector is preferably of the phase-frequency variety. A phase-frequency detector acts as a phase detector during lock and provides a frequency-sensitive signal to aid acquisition when the loop is out of lock. Filter 21 is a low-pass filter (e.g. RC filter) which is connected to the output of phase detector 17. Filter 21 keeps voltage-controlled oscillator (VCO) 25 from reacting too quickly by eliminating higher frequency inputs such as upper harmonics to VCO 25. VCO 25 outputs a signal which is digitized by analog-to-digital (A/D) converter 36 to serve as the system clock for microprocessor 2 of FIG. 1. Converter 36 can be a simple comparator which outputs a digital signal in response to the input to A/D converter 36 being above or below a certain level. The system clock operates at a frequency $f_{system}$. The output of VCO 25 is received by divide-by-six frequency divider 38. The signal from divider 38 serves as pixel clock PCK which operates at a frequency of $f_{pix}$. Generally, VCO 25 operates at roughly twelve times the frequency of the input signal to phase detector 17 once lock has been substantially achieved. Divide-by-two frequency divider 19 sends a signal back to phase detector 17 so that phase detector 17 can compare the phase of the input signal from DAC 20 of FIG. 1 with the phase of the signal from divider 19 for the purpose of sending a controlling output signal to VCO 25 in an effort to achieve lock. Analog phase-locked loop 22, with its 2× frequency multiplication, minimizes stressing (exceeding the maximum speed of the horizontal DTO) the system by reducing the speed at which DTO 6 of FIG. 1 must output data by about one-half than it would otherwise output at oscillator 10's frequency (oscillator 10 is shown in FIG. 1). The number of samples of horizontal DTO output data per period for analog phase-locked loop 22 is determined by the equation below.

$$2*\text{crystal clock frequency/pixel clock frequency} = \text{\# of samples/period} \quad (1)$$

For an NTSC clock frequency of 26.8 MHz, 4.36 samples are provided per period by the output of divider 38 in analog phase-locked loop 22.

Figure 3:
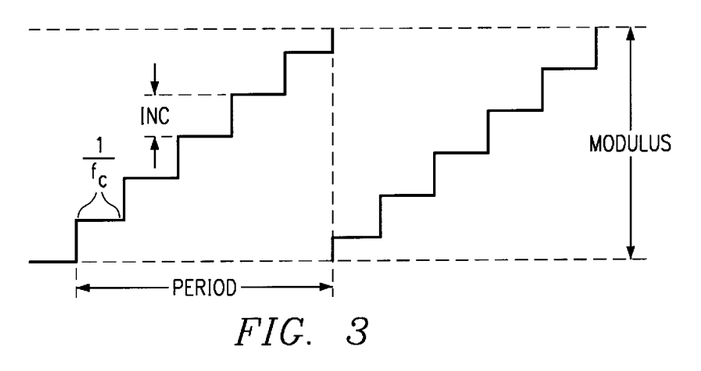
FIG. 3 illustrates a waveform corresponding to the output of the horizontal DTO.

Pixel clock PCK clocks both pixel counter 24 and analog-to-digital converter (ADC) 26 of FIG. 1. By definition, a pixel clock is used to quantize analog video information into pixels for each horizontal line of video information. A higher pixel clock frequency corresponds to the production of more pixels per horizontal line of video information. FIG. 3 illustrates a waveform corresponding to the output of DTO 6. DTO 6's 8 most significant bit (MSB) output to sine ROM 18 resembles a sawtooth wave form with stairsteps, as shown on the left-hand side of FIG. 3, with each stairstep equal to the increment (inc.) shown. The duration of each step is equal to the period of clock 8 of FIG. 1, $1/f_c$, where $f_c$ is the frequency of clock 8. Increments inc in FIG. 3 correspond to the increments generated by block 12 of FIG. 1. The number of stairsteps, x, multiplied by increment inc equals the modulus (inc*x=modulus) and $(1/f_c)x$=period. In other words, the number of stairsteps is determined by the horizontal DTO modulus divided by the increment value inc. Thus, the period of the sawtooth waveform of FIG. 3 is equal to the number of stair steps times the period of clock $1/f_c$ as reflected by the equation below.

$$\text{period} = (\text{modulus/inc})(1/f_c) \quad (2)$$

Since 1/period of the sawtooth waveform generated by DTO 6 of FIG. 1 is equal to the frequency of DTO 6, $f_{DTO}$, then $f_{DTO}$ is determined by the following equation, where n is the number of bits in the horizontal DTO accumulator.

$$f_{DTO} = f_c/(\text{modulus/inc}) = (\text{inc}/2^n)*f_c \quad (3)$$

DTO 6 of FIG. 1 serves to convert the crystal frequency of oscillator 10 of FIG. 1 to a lower output frequency which when multiplied by a phase lock loop (2×PLL 22 of FIG. 1) becomes the pixel clock frequency $f_{pix}$, where $$f_{pix} = \text{PLL factor}*f_{DTO}. \quad (4)$$

The PLL factor is the multiplication factor of the PLL of block 22 in FIG. 1 which is shown as two. The nominal pixel clock frequency, nominal $f_{pix}$, is also equal to the nominal number of pixels per line times the horizontal sync frequency $f_h$, where $$\text{nominal } f_{pix} = \text{nominal \# of pixels per line}*f_h \quad (5)$$

The horizontal DTO increment can be determined from the following equation which takes into account the PLL multiplication factor of 2. The increment, inc, of block 12 of DTO 6 in FIG. 1 can be calculated as follows:

$$\text{inc} = 2^n/\text{PLL factor}*f_{pix}/f_c \quad (6)$$

TABLE 1

| STD. | $F_h$(Hz) | Sampling Rate | Pixels Per Line | $f_{pix}$ (MHz) | $f_c$(MHz) | increment Hexadecimal |
|---|---|---|---|---|---|---|
| NTSC | 15734.26 | square pixel | 780 | 12.27 | 26.8 | 3a9dbl |
| NTSC | 15734.26 | ITU-R BT.601 | 858 | 13.5 | 24.576 | 465000 |
| PAL | 15625 | square pixel | 944 | 14.75 | 26.8 | 4672a0 |
| PAL | 15625 | ITU-R BT.601 | 864 | 13.5 | 24.576 | 465000 |
| MPAL | 15734.26 | square pixel | 780 | 12.27 | 26.8 | 3a9dbl |
| MPAL | 15734.26 | ITU-R BT.601 | 858 | 13.5 | 24.576 | 465000 |
| NPAL | 15625 | square pixel | 944 | 14.75 | 26.8 | 4672a0 |
| NPAL | 15625 | ITU-R BT.601 | 864 | 13.5 | 24.576 | 465000 |

Table 1, above, lists the hexadecimal increment value for different TV standards and sampling rates where n=24 bits. The various standards shown above can easily be implemented according to the invention by changing the horizontal DTO nominal increment values, $f_{pix}$ and chroma trap coefficients. Although $f_{pix}$ changes involve a change of the crystal 8 of FIG. 1, the other parameters are easily changed in software for a microprocessor implemented system.

Referring back to FIG. 1, analog-to-digital converter 26 receives composite video information in connection with clocking an output to a notched filter 28 (an known as a chroma trap) for filtering chroma frequencies. Analog-to-digital conversion occurs at pixel clock frequency $f_{pix}$. Pixel counter 24 also counts at pixel clock frequency $f_{pix}$ in connection with being clocked by the pixel clock frequency generated by 2×PLL 22. For NTSC (National Television Standards Committee) systems the color burst signal frequency is around 3.58 MHz. This frequency range corresponds to the color-burst signal in the composite video. The color-burst signal is approximately nine cycles of the chrominance subcarrier added to the backporch of the horizontal sync pulse of the composite color signal and is used in a color receiver as a phase reference. More simply put, the color burst allows the color decoder to decode the color information contained in an active line of video. The color burst signal is filtered out so that it will not interfere with processing the horizontal sync signal in connection with incrementing DTO 6. The digital information from analog-to-digital converter 26 as filtered by chroma trap 28 is provided to the inputs of coarse phase detector 30 and fine phase detector 32. Coarse phase detector 30 detects the presence of the horizontal sync pulse in a signal by detecting a negative pulse of at least a predetermined minimum width. For instance, a horizontal sync pulse can be identified by pixel data received which is below a specified threshold for a predetermined number of clock cycles. In connection with the detection of the horizontal sync pulse, which is indicative of the end of a line of horizontal video pixels, the current value in pixel counter 24 is saved in a register accessed by microprocessor 2. Microprocessor 2 reads the saved pixel value and compares it against a nominal desired value. The nominal desired value is determined in connection with using a filter window for determining when phase lock is achieved. In an experimental model of the invention, windows lasting 15 clock pulses were used. Lock should be achieved by phase shifting the sync pulse so that its falling edge lines up with the center of the filter window. In a preferred embodiment of the invention, a detected falling edge which stays at a logic low level for at least 16 clock pulses defines a sync pulse. When the falling edge of horizontal sync occurs at the center of the phase detector window, the pixel count is 7. There are about 14 clock pulses worth of pipeline (miscellaneous system, e.g. propagation) delays. Consequently, the nominal desired pixel counter value includes the 16 clock pulses of a low logic level, the 7 clock pulses to the center of the filter window and the 14 clock pulses of pipeline delays. Thus, the nominal desired pixel counter value, which corresponds to the locked condition, is 37.

Figure 4:
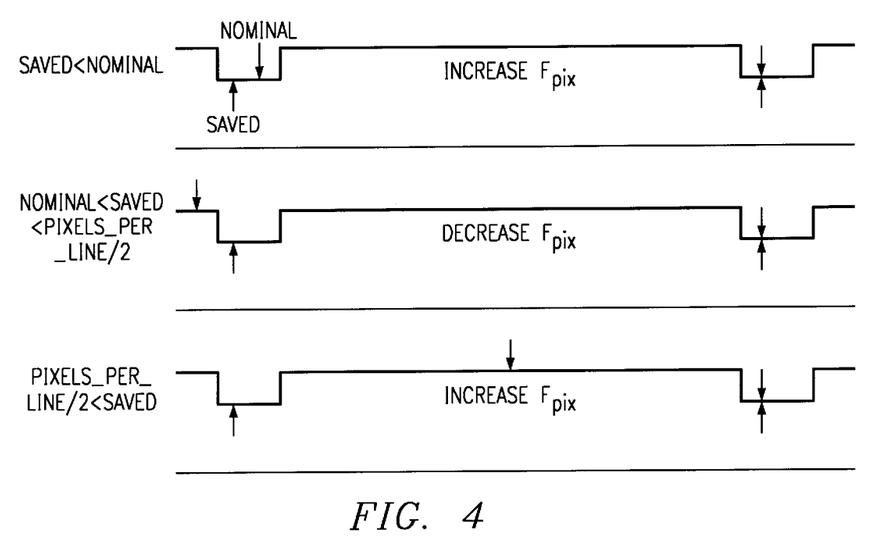
FIG. 4 illustrates graphs showing three aforementioned possible nominal value to saved value relationships with the nominal value represented by a down arrow and the saved value represented by an up arrow.

The output frequency of DTO 6 and the pixel clock frequency generated by 2×PLL 22 are adjusted in coarse increments to match the saved pixel counter value with the nominal desired value. The output frequency adjustments of DTO 6 are made in connection with phase detector 30 which produces an adjustment frequency proportional to the phase difference of the falling edge of the sync signal and the center of the filter window. If the saved pixel counter value is less than the nominal value then the phase detector produces an adjustment frequency which causes the output frequency of DTO 6, (and correspondingly the pixel clock frequency) to increase in order to run pixel counter 24 faster and achieve a match between the saved value and the desired nominal value. If the saved value is greater than the nominal value, then coarse phase detector 30 causes the pixel clock frequency (and correspondingly pixel counter 24 and the output frequency of DTO 6) to decrease unless the saved value is greater than ½ the number of pixels per line of video, in which case the pixel clock frequency is increased (this choice resulting in the fastest possible path to the locked condition). FIG. 4 illustrates graphs showing the three aforementioned possibilities with the nominal value represented by a down arrow and the saved value represented by an up arrow. The locked result is represented by the meeting of two arrow heads. During the vertical sync interval, the serration and equalization pulses occur at twice the horizontal sync frequency. Once the coarse lock logic has detected a sync, it is not rearmed until a minimum of ¾ of the line time has elapsed so that detection of these half line pulses is avoided. This is a novel characteristic of the invention.

Figure 5:
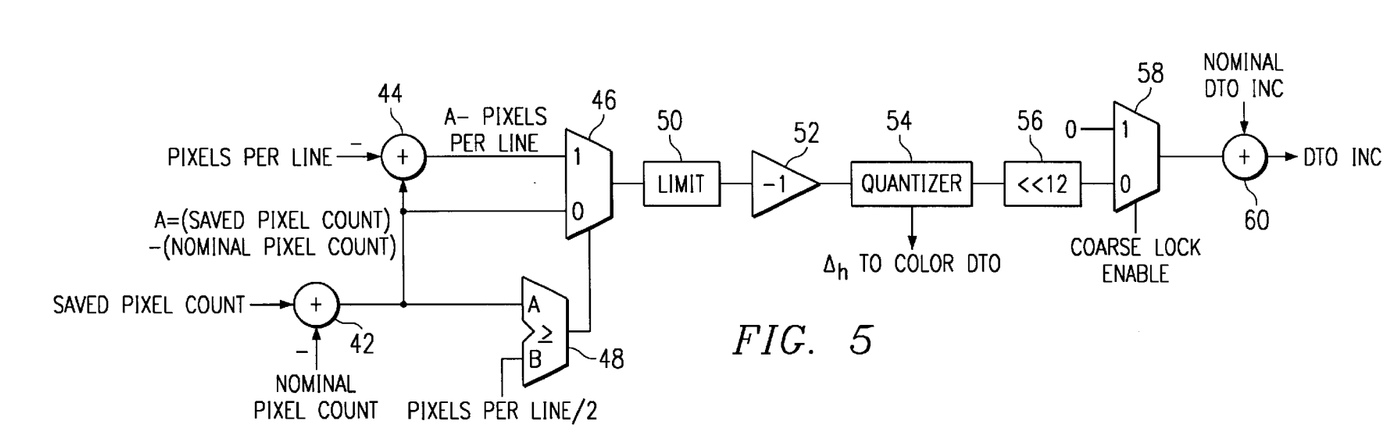
FIG. 5 illustrates a block diagram demonstrating the logic behind the coarse phase lock processing performed by the coarse phase detector of FIG. 1.

FIG. 5 illustrates a block diagram demonstrating the logic behind the coarse phase lock processing performed by coarse phase detector 30 of FIG. 1. The processing shown in FIG. 5 can be achieved in software. With reference to FIG. 5, adder 42 adds the saved pixel count to a negated nominal pixel count. Adder 44 adds the output of adder 42, which is equal to variable A (saved pixel count minus the nominal pixel count), to a negated number of pixels per line expected per the system chosen (e.g., for the standards as shown in table 1 where the pixels per line are listed in a column in the table.) Multiplexer 46 selects the output adder 42 or rather variable A or it selects the output of adder 44 which represents variable A minus the pixels per line. Comparator 48 controls this selection on the basis of whether variable A is greater than variable B which represents the number of pixels per line divided by 2. If variable A is greater than or equal to variable B then multiplexer 46 selects the input labeled (A-pixels per line) otherwise multiplexer 46 selects the input of variable A. Multiplexer selections of variable A minus pixels per line and variable A, which represent delta correction numbers, are limited by limit block 50 to a value of ±31 so that the coarse correction to the horizontal DTO frequency does not stress the hardware. This limited delta correction is negated by inverter 52 and quantized by quantizer 54 to certain values (e.g. −31, −16, −8, −4, −2, −1, 0, 1, 2, 4, 8, 16, 31, etc.). The quantized result is left shifted by shift register 56 by a predetermined number of bits to produce a value that is added to the nominal horizontal DTO increment. For example, for the embodiment shown in FIG. 5, the quantized result is shifted by 12 bits. If no sync pulse is detected, the coarse lock enable bit which is read by the microprocessor and controls multiplexer 58 is logic one and multiplexer 58 selects 0 as the input number to which the nominal horizontal DTO increment (inc) is added by adder 60 to serve as the horizontal DTO increment which is written by microprocessor 2 of FIG. 1 to increment block 12 of DTO 6 of FIG. 1. Therefore, the nominal horizontal DTO increment value as described in equation (6) is written to DTO 6 of FIG. 1. If a sync pulse is detected, then the coarse lock enable bit to multiplexer 58 is logic zero and the processed saved pixel count from shift register 56 is selected by multiplexer 58 and added by adder 60 to the nominal horizontal DTO increment (inc). The sum from adder 60 is written by microprocessor 2 of FIG. 1 to increment block 12 of DTO 6 of FIG. 1 and this serves as the horizontal DTO coarse adjustment increment. Quantizer 54 also delivers the quantized limited delta correction (Δh) to a color DTO increment control block which is shown and is explained in more below with respect to FIG. 18.

The consequence of establishing a coarse lock results in positioning the falling edge of the horizontal sync pulse within a 15 pixel clock wide gate window established in fine phase detector 32 of FIG. 1. The fine lock operation of fine phase detector 32 centers the edge of the horizontal sync pulse within the gate window with sub-pixel accuracy. This gate window is opened once per line and serves to avoid detection of false pulses such as those which occur during the vertical sync interval. The switch from coarse to fine lock is enabled when the absolute value of the flat window phase error falls below a predetermined threshold value.

Figure 6A:
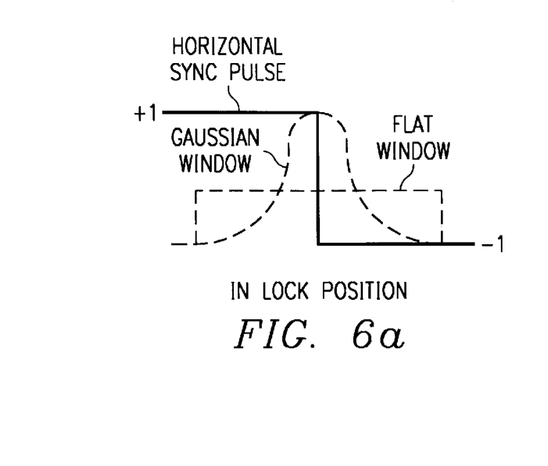
FIGS. 6a, 6b and 6c illustrate three graphs showing a gaussian window, and a flat window relative to a horizontal sync pulse, where the respective graphs are shown in locked position, with negative phase error (indicating the necessity for an increase in $f_{pix}$) and with positive phase error (indicating the necessity for a decrease in $f_{pix}$).
Figure 6B:
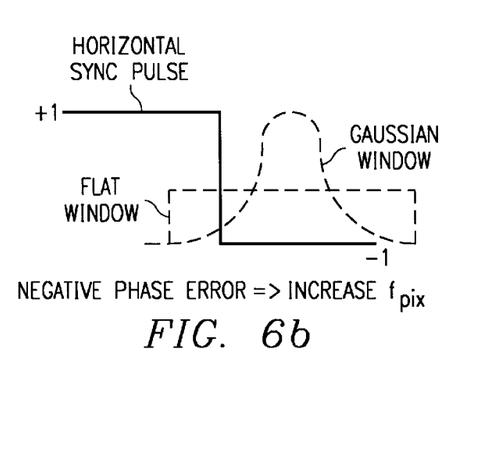
Figure 6C:
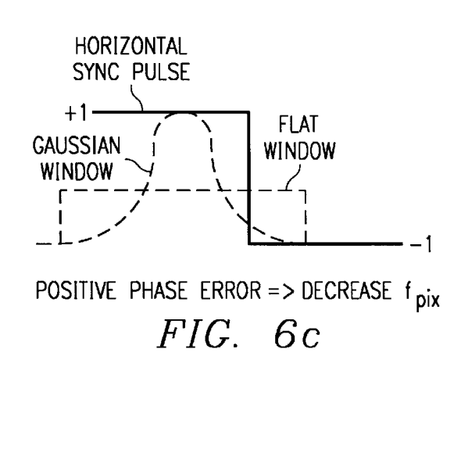

FIGS. 6a, 6b and 6c illustrate three graphs showing a gaussian window (the distribution within the window resembles a guassian weight distribution), and a flat window (the weight distribution with in the window is rectangular) relative to a horizontal sync pulse, where the respective graphs are shown in locked position, with negative phase error (indicating the necessity for an increase in $f_{pix}$) and with positive phase error (indicating the necessity for a decrease in $f_{pix}$). The sync pulse is normalized to fall between values of +1 and −1. Assuming multiplication by the windows of pixel information corresponding to the horizontal sync pulse, the flat window applies an equal weighting to the pixels while the gaussian applies heavier weights to the pixels multiplied by the gaussian waveform at points near the center of the waveform. The windows are enabled by the decode of pixel counter 24 which is clocked by pixel clock PCK of FIG. 1. If the sync edge falls to the left of the window, as shown in the FIG. 6b, then the pixel clock frequency must be increased in order to center the window on the sync edge to lock position as is shown in FIG. 6a. If the sync edge falls to the right, as shown in FIG. 6c, then the pixel clock frequency must be decreased to achieve lock.

Figure 7:
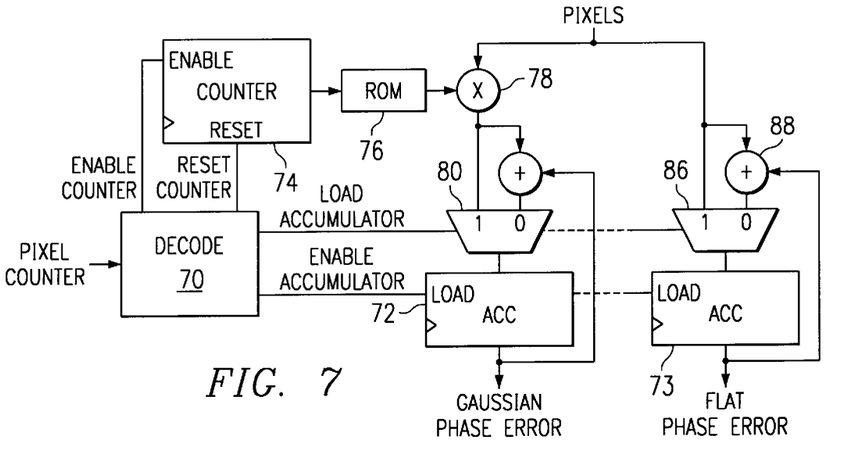
FIG. 7 is a block/logic diagram showing the architecture for the fine phase detector block of FIG. 1.

The architecture for fine phase detector block 32 of FIG. 1 is shown in the block/logic diagram of FIG. 7. Pixel decode logic block 70 generates signals based on the pixel counter which enables accumulator 72 and accumulator 73. In addition, an enable counter signal enables counter 74 which causes Read Only Memory (ROM) 76 to generate gaussian coefficient weights from a ROM lookup table. Multiplier 78 multiplies the gaussian coefficient weights by incoming digital pixel values. The output of multiplier 78 is sent to multiplexer 80 and summer 82. Multiplexer 80 selects either the product of the gaussian coefficient and an incoming pixel value, or the sum of the current output of accumulator 72 and the product of the gaussian coefficient and an incoming pixel value. The output of accumulator 72 represents the gaussian phase error between the center of a 15 pixel clock gaussian window and the horizontal sync pulse. The decode logic in decode block 70 generates signals based on the pixel counter which enable arithmetic logic within block 70 to cause accumulator 72 to accumulate gaussian phase error outputs through a feedback loop to summer 82. When the gaussian window is opened at count zero in an indexed count from zero to 14 (the duration of the gaussian window), the load accumulator line input to multiplexer 80, which controls multiplexer 80, goes high. At this time, the output of multiplexer 80 is loaded into accumulator 80. This loaded input serves as an initial value of the accumulator. The load accumulator line returns to logic low after indexed count 0. A flat phase error window of 15 pixel clocks wide is also opened at indexed count zero in the zero to 14 indexed count. The load accumulator line is also input to and controls multiplexer 86. When the load accumulator line goes high in connection with the gaussian window being opened, the flat window is also opened and the outputs from multiplexers 80 and 86 are loaded into their respective accumulators 72 and 73. The enable accumulator line which controls the loading of accumulator 72 and accumulator 73, goes to logic high at indexed count zero and it stays at logic high through indexed count 14. Multiplexer 86 selects either the indexed pixel values to be loaded into accumulator 73 or the sum of the indexed pixel value and the current accumulated indexed pixel values. The previous indexed pixel values are summed by summer 88 in connection with a feedback loop from the output of accumulator 73 and summer 88. The output of accumulator 73 represents the flat phase error.

The gaussian phase error is the accumulation of weighted values (the sum of the products of gaussian weight coefficients and the indexed pixel values). The flat phase error is the accumulation of the indexed pixels since all have the same weight. Microprocessor 2 of FIG. 1 reads the phase error outputs on every line. The phase error values must be normalized to fall between positive and negative limits. The normalized flat phase error is computed as shown below in equation (7) where the mid pixel value is equal to half the value of the sum of the horizontal sync back porch (the area of the video waveform between the rising edge of the horizontal sync and right before the active video) and the horizontal sync tip (the sync level). Typically, for an 8 bit analog-to-digital converter, there are $2^8=256$ levels corresponding to the range 0 . . . 255. The sync back porch lies at the 64th level while the sync tip lies at the zero level. Consequently, the mid pixel value (mid pix) is $(64+0)/2=32$, or the 32nd level.

$$\text{flat phase error} = \Sigma(pix_i - \text{mid pix}), i=0, \ldots$$
$$14 = \Sigma pix_i - 15 \cdot \text{mid pix} \quad (7)$$

The normalized gaussian phase error requires the subtraction of a similar normalization constant from the hardware output as shown below in equation (8).

$$\text{gaussian phase error} = \Sigma[coef_i \cdot (pix_i - \text{mid pix})], i=0, \ldots$$
$$14 = \Sigma(coef_i \cdot pix_j) - \text{mid pix} \cdot \Sigma(coef_i) \quad (8)$$

A programmable normalization constant enables the effective processing of weak and noisy signals. For instance, when a weak input signal is present which is noisy, this condition can be detected by microprocessor 2 of FIG. 1. When the sum of the detected sync (corresponding to a coarse lock enable being equal to zero) over a frame falls below a threshold value, the weak signal condition can be detected. Since the normal horizontal sync pulse corresponds to a pixel value of zero at the analog-to-digital converter output, the presence of noise raises the sync tip to a higher level. The mid point pixel (mid pix) also increases to a higher level. A factor of 1.5 is applied to the mid pix value to generate a normalization constant for this condition. Thus, a mid pix value of 32 under normal conditions, becomes 48 under the weak signal condition.

Figure 8:
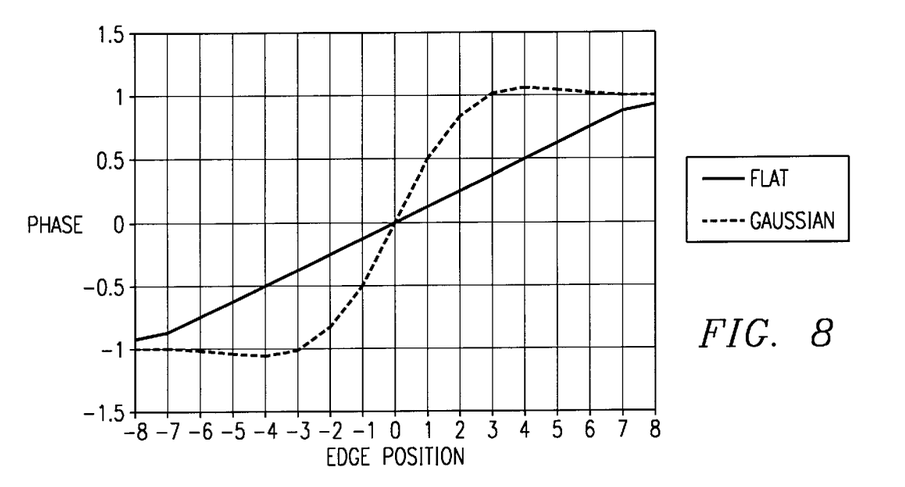
FIG. 8 is a graph illustrating phase error versus sync falling edge position for the gaussian and flat windows.
Figure 8A:
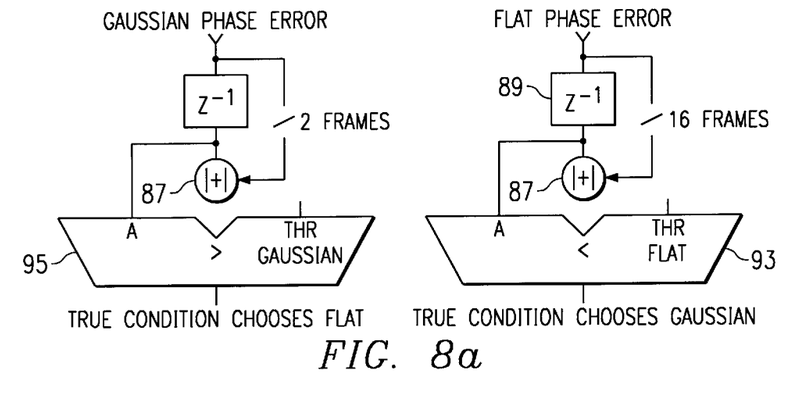
FIG. 8a illustrates a block diagram processing scheme using guassian and flat phase errors.
Figure 8B:
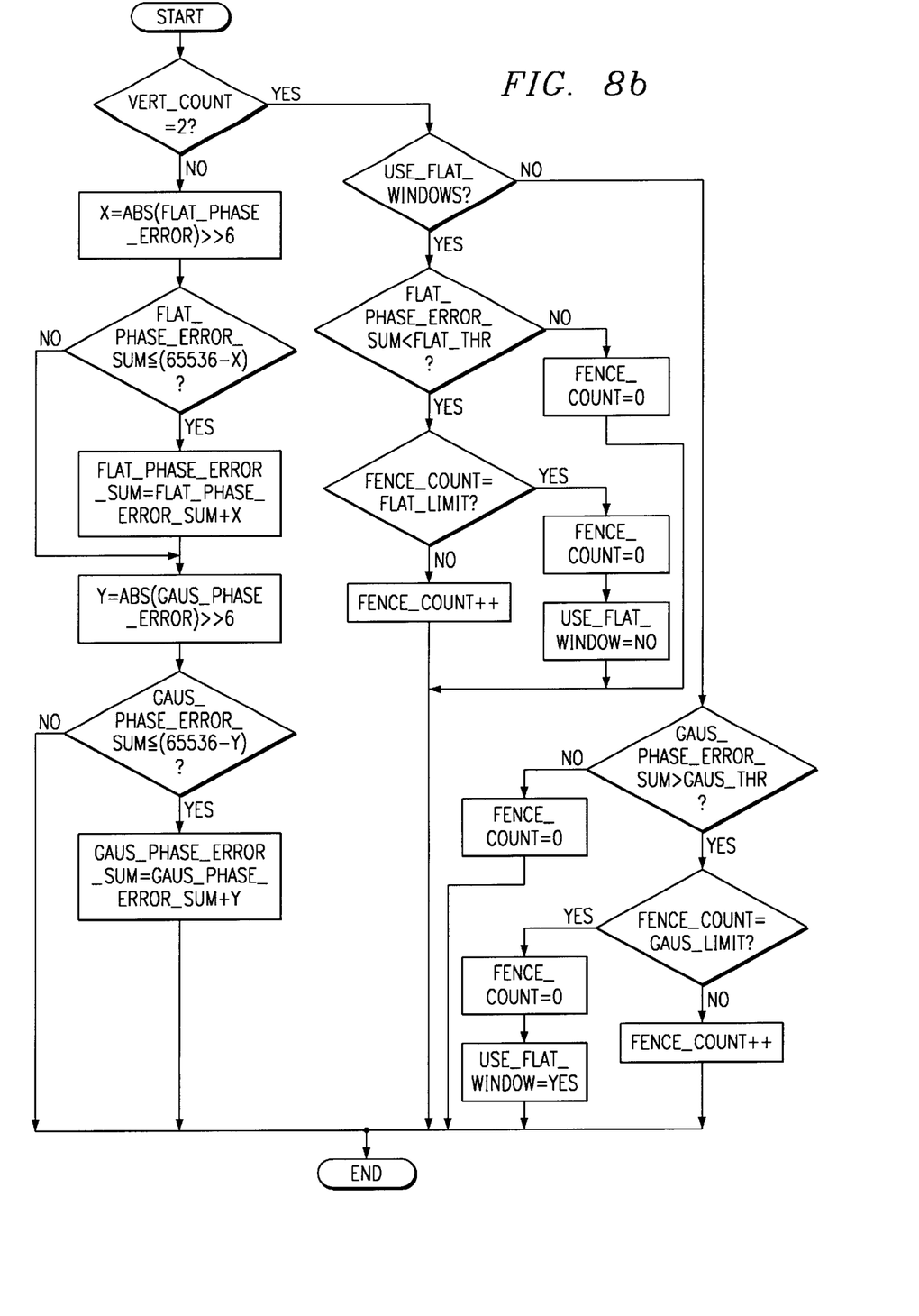
FIG. 8b illustrates a flow chart showing the steps occurring with respect to the gaussian window error and flat window processing.

FIG. 8 is a graph illustrating phase error versus sync falling edge position for the gaussian and flat windows. As shown, the width of the windows measure 15 pixels wide ±7 pixels each from the center of the window at 0. The gaussian window is narrower than the flat window and it has a higher gain within 3 pixels of the center window position. The flat window has a constant gain over the entire 15 pixel width. The gaussian window is used for fine lock to a standard video signal such as reception of television stations while the flat window is used for a non-standard video signal whose horizontal sync is not very stable such as the VCR and video games. The choice of window is determined by comparing the sum of the absolute value of the flat window phase error over a frame (525 video lines per frame) against a threshold. With reference to FIG. 8a which illustrates a block diagram processing scheme using guassian and flat phase errors, absolute value summers 87 sum the absolute values of consecutive phase error data per the respective frame values indicated through a respective delay block 89. Since each window may have a different lock position, the window selection process includes some hysteresis and a fence to prevent oscillation between the two windows. If the flat phase error sum is less than a threshold ($THR_{flat}$) for a predetermined number of consecutive frames, this predetermined number being defined as the "fence count" (e.g. 16), then the gaussian window is selected by comparator 93. If the gaussian phase error sum is greater than a threshold ($THR_{gaussian}$) for a predetermined number of consecutive frames (e.g. 2), then the flat window is selected by comparator 95. In an experimental software implementation of the invention, 16 bit registers were used to store phase error results. In order to prevent over flow, the register results were right shifted by six bits which has the effect of scaling the phase error results by $\frac{1}{2}^6$ or $\frac{1}{64}$th. It should be noted that the foregoing implementation shown in connection with FIG. 8a can be accomplished using software. In its preferred embodiment, the invention is implemented using software particularly with in a microprocessor-based system. FIG. 8b illustrates a flow chart showing the steps occurring with respect to the gaussian window error and flat window processing.

Figure 9:
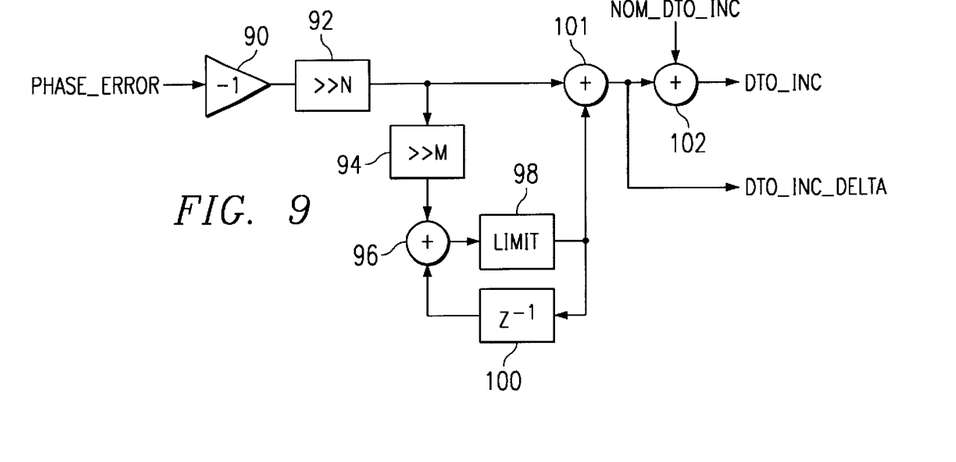
FIG. 9 is a logic diagram which illustrates the processing for the fine phase lock.

FIG. 9 is a logic diagram which illustrates the processing for the fine phase lock. The phase error is inverted by inverter 90 and right shifted n bits, where n is an integer, by shift register 92. The phase detector window selected determines n. The result from shift register 92 is then shifted right m bits by shift register 94 (m being an integer) and then accumulated, by summing the result with summer 96, using a line delayed feed back loop which limits the summed result between positive and negative limits (so that overflow does not occur) by virtue of limit block 98 and delay line block 100. The shift constants m and n are chosen to achieve desired phase-locked loop time constants and damping factors for TV (television) and VCR (video cassette recorder) modes of operation. These shift constants can easily be changed in software, particularly with a microprocessor-based system. The output from block 100 represents an accumulated offset characterized as a constant frequency error in the horizontal sync frequency that may occur in non-standard video. Summer 102 adds this accumulated offset with the output of shift register 92 and the nominal horizontal DTO increment (nom DTO inc) to produce an actual horizontal DTO increment (DTO inc) which is written to increment block 12 of FIG. 1. An additional output term DTO_inc_delta represents a term that is fed forward to the color DTO which is used to compensate the color DTO frequency for changes in the horizontal DTO frequency during fine lock; Δh is the fed forward term used during coarse lock. Since the pixel clock is derived from the horizontal DTO and it serves as the clock for the color DTO, an increase in the pixel clock frequency must be compensated for by a decrease in the color DTO frequency in order to maintain a constant color oscillator frequency.

Figure 10:
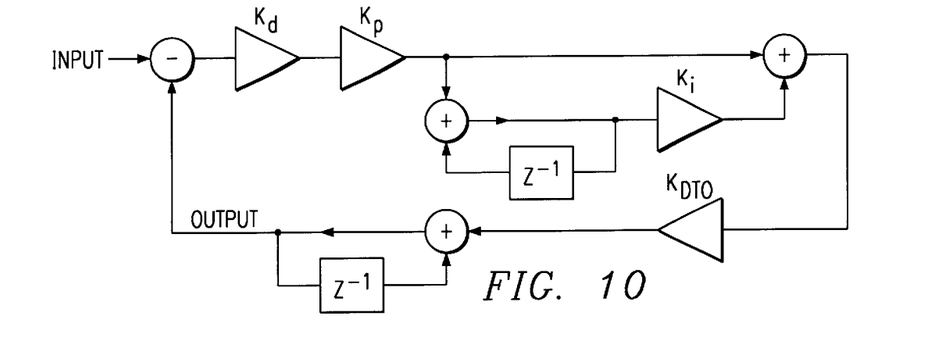
FIG. 10 illustrates a block diagram of a horizontal phase logic loop of the invention.

FIG. 10 illustrates a simplified block/logic diagram of the invention's horizontal phase logic loop. A phase value is input and there are two accumulator blocks labeled $z^{-1}$ and four gain blocks, $K_d$, $K_p$, $K_i$, and $K_{DTO}$. $K_d$ is the phase detector gain in units of least significant bits (LSBs) per pixel. $K_p = \frac{1}{2}^n$ is a proportional gain applied to the phase error. $K_i = \frac{1}{2}^m$ is an integral gain applied to the phase error accumulator. $K_{DTO}$ is the DTO gain in units of pixels per LSB. $K_{DTO}$ is computed as the phase shift in pixels generated by one LSB change in the horizontal DTO increment as indicated by formula (9) below.

$$K_{DTO} = \text{pixels per line} * [1/(1+1/\text{nominal inc})-1] \qquad (9)$$

The response of the invention's horizontal phase locked loop to a step change in input for the flat and gaussian phase detectors can be characterized as follows. The flat window has a relatively small time constant and a large damping factor which enables fast response to head switching transients in the VCR mode. The gaussian window has a large time constant and smaller damping factor which enables a slow response to a TV signal which may have a smaller signal to noise ratio.

Figure 11:
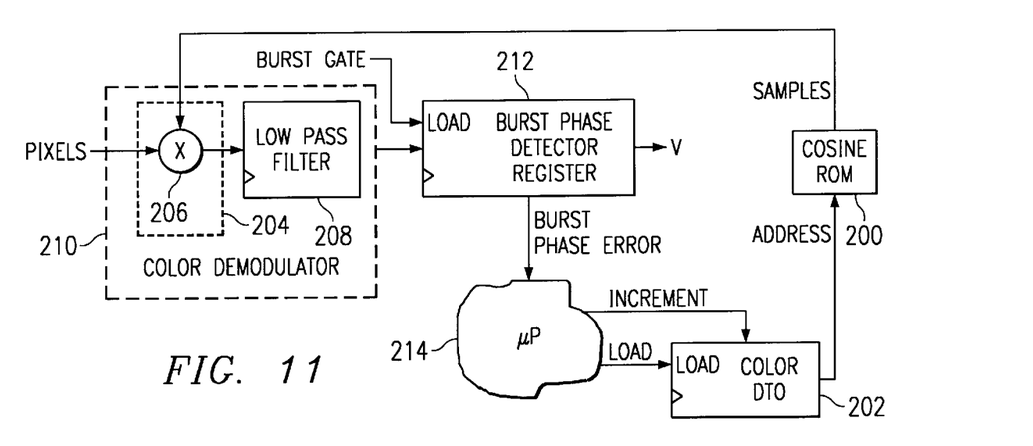
FIG. 11 illustrates a block diagram of the color phase-locked loop of the invention.

In a color video system, a portion of the modulation on the video carrier performs by itself the functions of a carrier. This modulating frequency is called a subcarrier. After being detected and separated form the video carrier, the subcarrier must undergo further demodulation before the characteristics of the modulating signal which is conveyed by the subcarrier can be obtained. The chrominance signal within the composite video signal changes phase with every change in the hue of the color it represents and the phase difference between the chrominance signal and the output of the subcarrier generator identifies the particular hue at that instant. When the chrominance signal reaches the video decoder, the video decoder must have some means of comparing the phase of the signal with a fixed reference phase which is identical to that of the subcarrier generator at the transmission source of the composite video signal. This reference phase is provided in the video decoder by the discrete time oscillator which is synchronized with phase provided by the subcarrier generator by means of the color burst signal that is transmitted during the horizontal blanking period. The color burst frequency is usually specified as that of the chrominace subcarrier. The color phase-locked loop implements the noted phase synchroniztion of the reference phase with the generated subcarrier phase. FIG. 11 illustrates a block diagram of the color phase-locked loop of the invention. This includes a color phase detector which is implemented by the multiplication of the composite video pixels by samples, output from cosine Read Only Memory (ROM) 200, which correspond to the local oscillator signal, which in this case is the signal from color discrete time oscillator (color DTO) 202. The invention herein can be adapted to accommodate video pixel information in many commonly-known color space formats, such as YUV, YIQ, YDbDr, YCbCr, PhotoYCC™, etc. However, in its preferred embodiment, the invention is used according to the YUV color space and the description henceforth is directed to use with this color space. Accordingly, the color pixel information contains U and V components which are quadrature modulated by the color subcarrier frequency $w_{sc}$. The multiplication is performed by multiplier 206. The result of the multiplication is low pass-filtered by low pass filter 208. Multiplier 206 and low pass filter 208 together form color demodulator 210 which in connection with register 212, outputs the V component. Register 212 shall be referenced as burst phase detector register 212 since this register outputs the color burst phase error. Another color demodulator (not shown) in connection with a sine ROM (not shown) is used in a phase-locked loop to output the U component. The U component is used to generate color killer, automatic color gain control, etc. and it is not used to determine color phase synchronization. Burst phase detector register 212 provides the color burst phase error to microprocessor (P) 214 which controls color DTO 202.

Figure 12A:
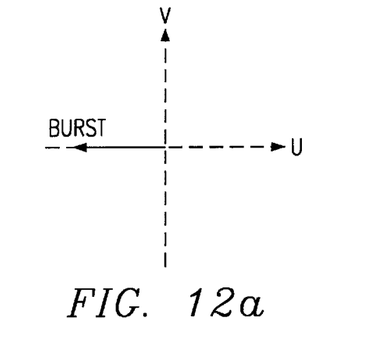
FIG. 12a illustrates the phase relationship of the U and V video components with respect to one another and with respect to the color burst signal (burst) during phase lock.
Figure 12B:
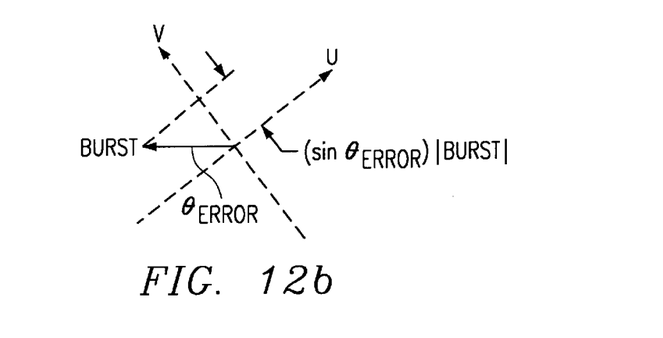
FIG. 12b illustrates the phase relationship of the U and V video components with respect to one another and with respect to the color burst signal when lock has not been achieved and when a phase error of $\theta_{error}$ exists between the color burst and the UV axis.

The relationship of the color burst signal to the U and V color components of the composite video signal is illustrated in the graphs of FIGS. 12a and 12b. FIG. 12a illustrates the phase relationship of the U and V video components with respect to one another and with respect to the color burst signal (burst) during phase lock. As shown, the magnitude of the burst is aligned with the U axis. The phase relationship of the burst with respect to the U axis is 180°. FIG. 12b illustrates the phase relationship of the U and V video components with respect to one another and with respect to the color burst signal when lock has not been achieved and when a phase error of $\theta_{error}$ exists between the color burst and the U axis. The UV axis corresponds to the phase of the discrete time oscillator. Multiplication of the burst by the an appropriate discrete time color oscillator signal, as by multiplier 206 of FIG. 11, followed by low pass filtering (as is accomplished by low pass filter 208 of FIG. 11) of subcarrier harmonics will produce a filtered output which is a function of $\sin \theta_{error}$. With reference to FIG. 12b, the sine of phase error $\theta_{error}$ times the magnitude of the burst represents the projection of the burst onto the V axis. This projection is representative of the filter output. The above described multiplication and filtering process are represented by the equations below wherein the burst level is represented in relation to a dc level above the sync tip and the color discrete time oscillator outputs a signal which is a function of the color burst:

$$\text{burst} = dc - \sin w_{sc} t \qquad (10)$$

$$\text{color DTO} = \cos(w_{sc} t + \theta_{error}) \qquad (11)$$

$$\text{color DTO} * \text{burst} = dc * \cos(w_{sc} t + \theta_{error}) - [\sin(2w_{sc} t + \theta_{error}) + \sin \theta_{error}]/2 \qquad (11)$$

$$\text{filter output} = \sin(\theta_{error})/2 \qquad (12)$$

The color DTO is incremented by an amount equal to $-\theta_{error}$ to drive the phase error to zero.

Figure 13A:
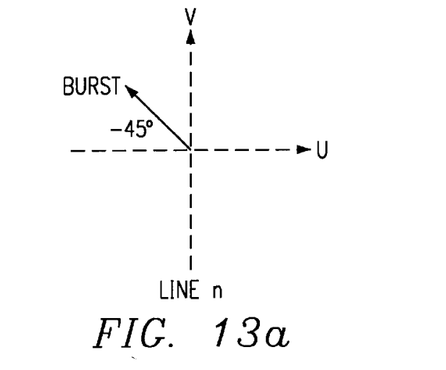
FIGS. 13a and 13b are graphs which show the relationship of the V and U color information component axes in relation to the color burst per line n and line n+1 (where n is an integer) when phase lock is achieved.
Figure 13B:
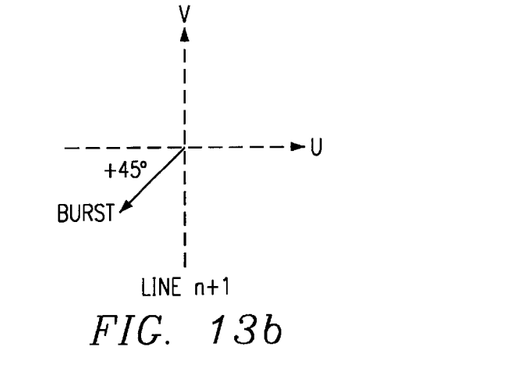

In the PAL television standard the phase of the V component alternates by ±45 degrees every line such that color subcarrier phase errors produce complementary errors which may be cancelled by a two line average. FIGS. 13a and 13b are graphs which show the relationship of the V and U color information component axes in relation to the color burst per line n and line n+1 (where n is an integer) when phase lock is achieved. For line n of video information, the color burst is shown at 135° (−45° with respect to the negative U axis). For line n+1 of video information, the color burst is shown at 225° (45° with respect to the negative U axis).

Figure 14A:
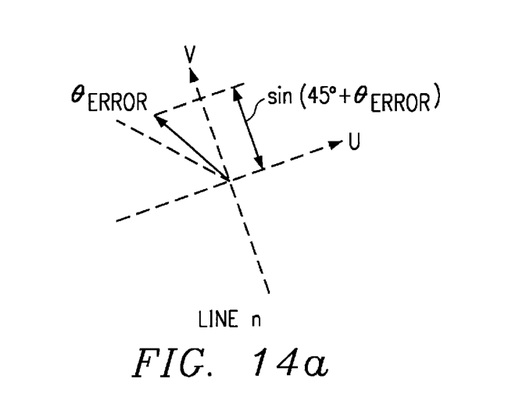
FIGS. 14a and 14b illustrate the relationship of the V and U color information component axes in relation to the color burst per line n and line n+1 when phase error is present.
Figure 14B:
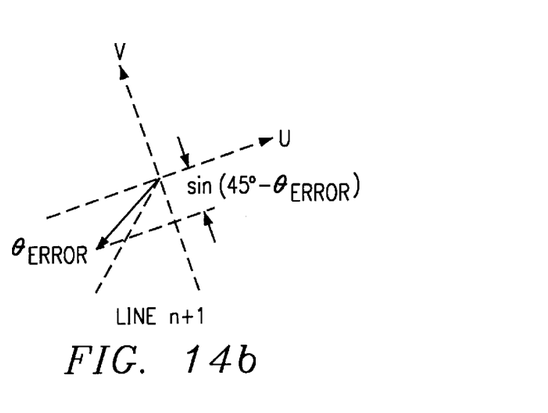

FIGS. 14a and 14b illustrate the relationship of the V and U color information component axes in relation to the color burst per line n and line n+1 when phase error is present. The phase error, $\theta_{error}$, is shown relative to the position of the burst phase at lock (FIGS. 13a and 13b). Additionally, the burst projection on the V axis, $\sin(45°+\theta_{error})|burst|$, and $\sin(45°-\theta_{error})|burst|$ for the nth and the nth+1 lines is shown in FIGS. 14a and 14b. Multiplication of the burst by the an appropriate discrete time color oscillator signal followed by low pass filtering of subcarrier harmonics will produce a filtered output having some multiple of the $\sin(45°\pm\theta_{error})/2$. The above described multiplication and filtering process are represented by the equations below wherein the burst level is represented in relation to a dc level above the sync tip and the color discrete time oscillator outputs a signal which is a function of the color burst:

Since 1/period of the sawtooth waveform generated by color DTO 202 of FIG. 11 is equal to the frequency of color DTO 202, $F_{CDTO}$, the $F_{CDTO}$ is determined by the following equation, where n is the number of bits in the color DTO accumulator (e.g., 24).

$$f_{CDTO}=f_{pix}/(\text{modulus}/\text{inc}_{sc})=(\text{inc}_{sc}/2^n)*f_{pix} \qquad *(18)$$

The nominal color DTO increment, $\text{inc}_{sc}$, can be determined from the following equation:

$$\text{inc}_{sc}=2^{24}*f_{CDTO}/f_{pix} \qquad (19)$$

Table 2 list the nominal increments in hexadecimal for the television standards and sampling rates shown.

TABLE 2

| SAMPLING RATE | NTSC | PAL | PAL M | PAL N |
|---|---|---|---|---|
| square pixel | 4aaaab | 4cf318 | 4a95a9 | 3e2b80 |
| CCIR601 | 43E0F8 | 541316 | 43CDE0 | 43ED29 |

The 11 MSBs output from color DTO 202 of FIG. 11 are used as an address to cosine ROM 200 of FIG. 11 and to a

| Line n | Line n + 1 |
|---|---|
| (13) burst = dc − $\sin(w_{sc}t - 45°)$ | burst = dc − $\sin(w_{sc}t + 45°)$ |
| (14) color DTO = $\cos(w_{sc}t + \theta_{error})$ | color DTO = $\cos(w_{sc}t + \theta_{error})$ |
| (15) color DTO*burst = $\cos(w_{sc}t + \theta_{error})$ | color DTO*burst = $\cos(w_{sc}t + \theta_{error})$ |
| −[$\sin(2w_{sc}t - 45° + \theta_{error})$ | −[$\sin(2w_{sc}t - 45° + \theta_{error})$ |
| −$\sin(45 + \theta_{error})$]/2 | −$\sin(45 + \theta_{error})$]/2 |
| (16) filter output = $\sin(45° + \theta_{error})/2$ | −$\sin(45° + \theta_{error})/2$ |

Figure 15:
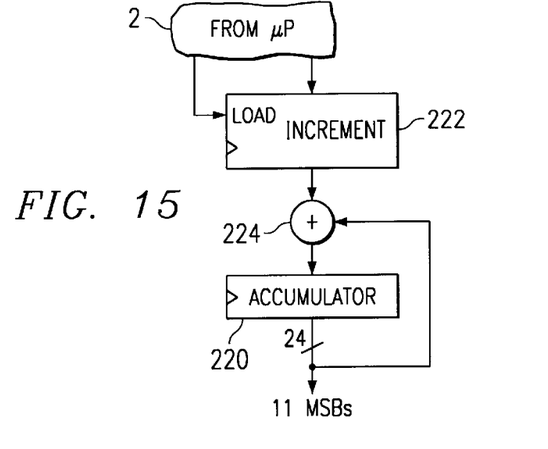
FIG. 15 illustrates a block diagram of the color DTO.
Figure 16:
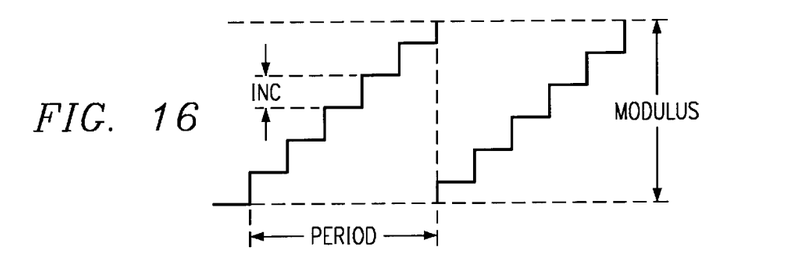
FIG. 16 illustrates a waveform corresponding to the output of the accumulator of the color DTO.

The color DTO is incremented by an amount to drive the phase error to zero. With reference to FIG. 15 which illustrates a block diagram of the color DTO, accumulator register (ACC) 220 is incremented by a value in increment register 222 through summer 224 as controlled by microprocessor 2 which loads values into register 222. The ACC value increments until it reaches an upper limit or modulus determined by the number of bits in the register. For the color DTO shown in FIG. 15, this modulus is $2^n$, where n is an integer. The color DTO output comprises the 11 most significant bits (MSBs) of accumulator 220's output. Such an output resembles a sawtooth waveform with stairsteps wherein each stairstep is equal to the increment value. Such a representation is shown in FIG. 16 which illustrates a waveform corresponding to the output of accumulator 220 (shown in FIG. 15) of color DTO 202 (shown in FIG. 11). DTO 202's 11 most significant bits (MSBs) are output to a sine ROM (not shown) and to cosine ROM 200 (shown in FIG. 11). This output resembles a sawtooth waveform with stairsteps, as shown on the left-hand side of FIG. 16, with each stairstep equal to the increment ($\text{inc}_{sc}$) shown. The duration of each step is equal to the period of the pixel clock frequency generated from horizontal DTO 6 of FIG. 1. This duration is $1/f_{pix}$, where $f_{pix}$ is the pixel clock frequency. Increments inc in FIG. 16 correspond to the increments generated by increment register 222. The number of stairsteps, x multiplied by increment inc equals the modulus ($\text{inc}_{sc}*x+\text{modulus}$) and ($1/f_{pix}$)x=period. In other words, the number of stairsteps is determined by the color DTO modulus divided by the increment value, $\text{inc}_{sc}$. Thus, the period of the sawtooth waveform of FIG. 16 is equal to the number of stair steps times the period of the pixel clock, $f_{pix}$ as reflected by the equation below.

$$\text{period}=(\text{modulus}/\text{inc}_{sc})(1/f_{pix}) \qquad (17)$$

sine ROM (not shown), which output data points corresponding to the color DTO signals input to a color demodulator (e.g. color demodulator 210 of FIG. 11). In order to minimize the ROM size, data points for angles ranging from 0° to 45° are stored in the sine ROM (sin ROM) and cos ROM (cos ROM) according to the following relations:

(20) sin ROM(i) = $\sin[(2i + 1)*45°/512]$, i = 0,1 . . . 255
(21) cos ROM(i) = $\cos[(2i + 1)*45°/512]$, i = 0,1 . . . 255

Figure 17:
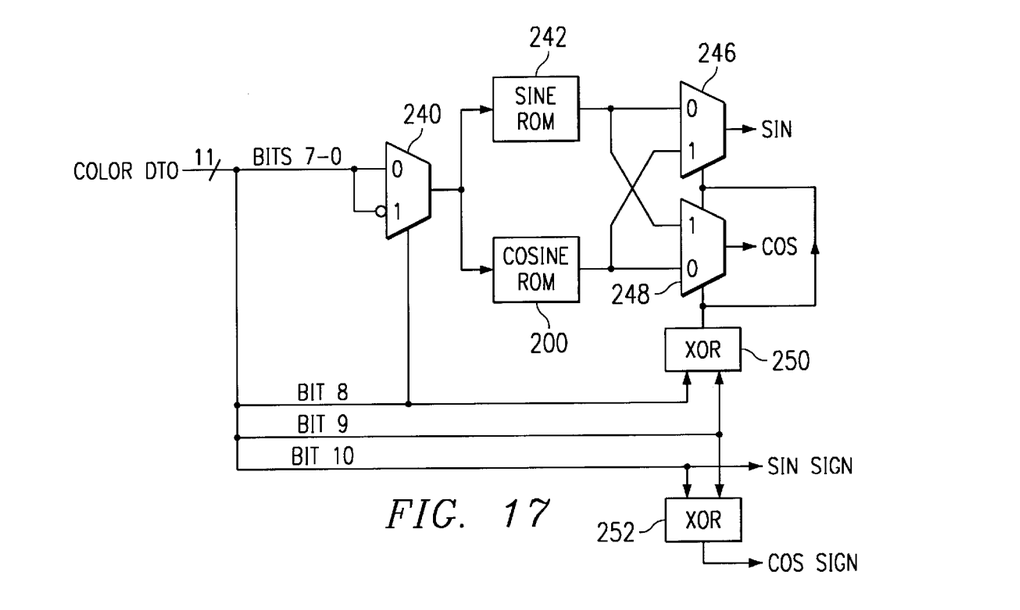
FIG. 17 illustrates a block diagram of the arithmetic logic which outputs the sine and cosine data points and signs.

FIG. 17 illustrates a block diagram of the arithmetic logic which outputs the sine and cosine data points and signs. Bits 7-0 address the ROMs and bits 10-8 control the multiplexers and generate the signs. As shown in FIG. 17, bits 0 through 7 of the 11 MSBs are sent to multiplexer 240. The logic 1 input of multiplexer is inverted while a true input of bits 7 through 0 is received at the logic 0 input of multiplexer 240. By commonly used convention, the input at the 0 or the 1 input to the multiplexers shown herein is determined by the binary value at the control input (shown as the line drawn in between the parallel lines of the parallelogram-shaped multiplexer). A logic 1 control input selects the logic 1 input to the multiplexer, while the logic 0 control input selects the logic 0 input to the multiplexer. The sine and cosine functions corresponding to the input bits to the sine and cosine ROMs respectively, from multiplexer 240, are output to multiplexers 246 and 248 which output sine (sin) and cosine (cos) functions respectively. A predetermined combination of bits 8 through 10 are input to exclusive OR gates 250 and 252 which output a binary result derived from exclusive ORing of the input. The arithmetic logic shown in FIG. 17 allows a much smaller sine and cosine ROM. Specifically, without the multiplexing shown in FIG. 11, $2^{11}$ or 2,048 data points would have to be converted with the ROMs. The arithmetic logic of FIG. 17 reduces this number by a factor of 8 using only $2^8$ (e.g. bits 7-0), or 256 data point conversions. A feature of the arithmetic logic is that data from the sine ROM, where appropriate, can be used to supply the output of either multiplexer 246 or 248 through the cross-coupled connections shown in FIG. 17. Likewise, another important feature of the arithmetic logic is that data from the cosine ROM, where appropriate, can be used to supply the output of multiplexers 246 and 248. Table 3 below illustrates the angle functions of $w_{sc}t$, output by the sine and cosine ROMs. The outputs from multiplexer 246 are listed in the column under $\sin w_{sc}t$, while the outputs from multiplexer 248 are listed in the column under $\cos w_{ws}t$. A negative sign before the entries in the columns are determined by the sin sign and cos sign outputs shown in FIG. 17. A zero value of sin sign and cos sign corresponds to a positive sin $w_{sc}t$ and a positive cos $w_{sc}t$ entry for the particular bit combination at bits 10 through 8. A logic one value of sin sign and cos sign correspond to a negative cos $w_{sc}t$ and a negative cos $w_{sc}t$ entry for the particular bit combination at bits 10 through 8.

TABLE 3

| BITS 10-8 | $w_{sc}t$ | $\sin w_{sc}t$ | $\cos w_{sc}t$ |
|---|---|---|---|
| 000 | 0°–45° | $\sin w_{sc}t$ | $\cos w_{sc}t$ |
| 001 | 45°–90° | $\cos(90° - w_{sc}t)$ | $\sin(90° - w_{sc}t)$ |
| 010 | 90°–135° | $\cos(w_{sc}t - 90°)$ | $-\sin(w_{sc}t - 90°)$ |
| 011 | 135°–180° | $\sin(180° - w_{sc}t)$ | $-\cos(180° - w_{sc}t)$ |
| 100 | 180°–225° | $-\sin(w_{sc}t - 180°)$ | $-\cos(w_{sc}t - 180°)$ |
| 100 | 225°–270° | $-\cos(270° - w_{sc}t)$ | $-\sin(270° - w_{sc}t)$ |
| 110 | 270°–315° | $-\cos(w_{sc}t - 270°)$ | $\sin(w_{sc}t - 270°)$ |
| 111 | 315°–360° | $-\sin(360° - w_{sc}t)$ | $\cos(360° - w_{sc}t)$ |

Figure 18:
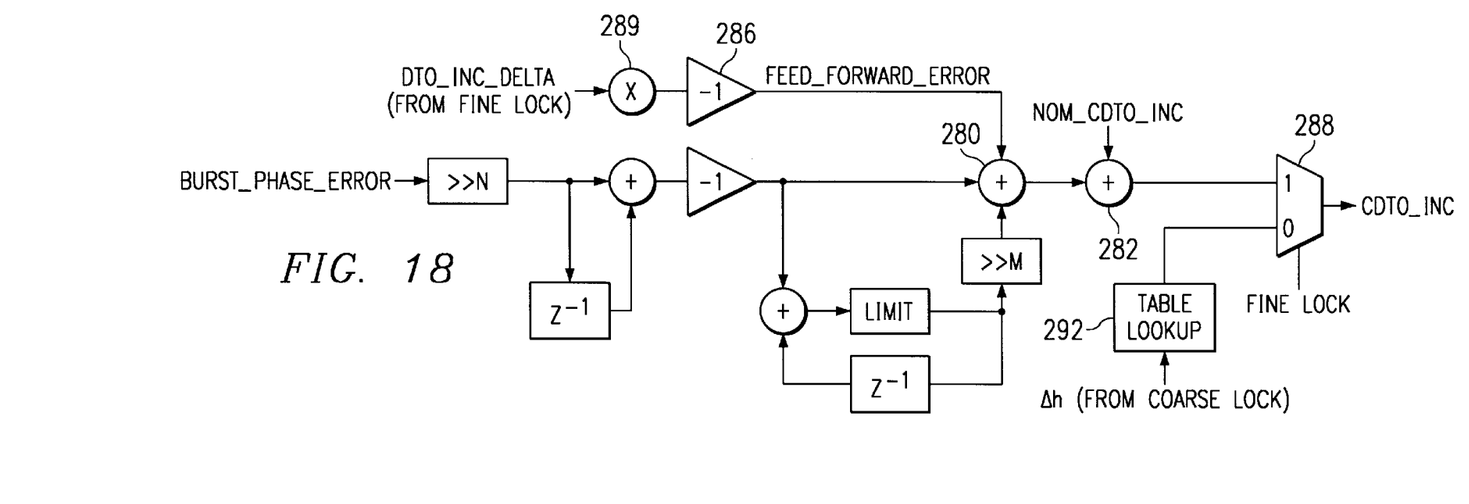
FIG. 18 is a block diagram illustrating the processing control of the color phase-locked loop performed by microprocessor 2.

FIG. 18 is a block diagram illustrating the processing control of the color phase-locked loop performed by microprocessor 2 of FIG. 1. With reference to FIG. 11 and FIG. 18, the burst error, corresponding to a particular line of video, as determined by microprocessor 2 after processing some function (e.g. $-\sin^{-1}$) of the filter output (as shown in equations (12) and (16)) stored in register 212, from filter 208, is right shifted n bits by microprocessor 2. The n bit shift is represented functionally by block 260. This corresponds to multiplication by a proportional shift constant $K_p$. This result is added (represented functionally by block 262) to a previous video line result (represented functionally by block 264) corresponding to the burst error for the previous line. The resulting two line sum is negated, as with functional block 266. Note that elements shown in FIG. 18 are referenced functionally, since the functions and elements in FIG. 18 are preferably accomplished by and in microprocessor 214 of FIG. 11. Alternatively, the elements of FIG. 18 and the functions accomplished therewith can be done in hardware. The negative two line sum is accumulated, as with functional block 268 which comprises adder 270, limit block 272 and delay block 274, and right shifted (as with functional right shift block 276) m bits. This corresponds to multiplication by an integral constant $K_i$, the resulting product of which is added (as with functional adder 280) to the negative two line sum and to a feed forward error (feed_forward_error) term. During the horizontal coarse lock mode of operation, the feed_forward_error term, $\Delta_h$, is generated from quantizer 54 of FIG. 5, and input to functional lookup table 292 of FIG. 18. During the horizontal fine lock mode of operation, dto_inc_delta from summer 101 of FIG. 9 is multiplied (using functional multiplier 294) by a scale factor and negated by functional block 286. The sum of functional adder 280 is added to the nominal color DTO increment (nom_CDTO_inc) by functional adder 282, the sum of which provides an input to multiplex 288. Lookup table 292 provides the second input to multiplexer 288. The fine lock signal controls multiplexer 288 which outputs the color DTO increment value. Since the color DTO is clocked by 2×PLL 22 of FIG. 1 which provides pixel clock pulse frequency $f_{pix}$, which, in turn, is controlled by the horizontal phase lock loop (as generally shown in FIG. 1), changes in the pixel clock frequency must be compensated by a change in frequency of the color DTO (shown as color DTO 202 in FIG. 11). The nominal color DTO increment corresponding to a particular television and/or video standard and the sampling rate are added to produce the color DTO increment that is written to hardware. The color DTO increment varies in order to minimize the color burst phase error, drive it to zero and achieve lock with the incoming color burst.

Figure 19:
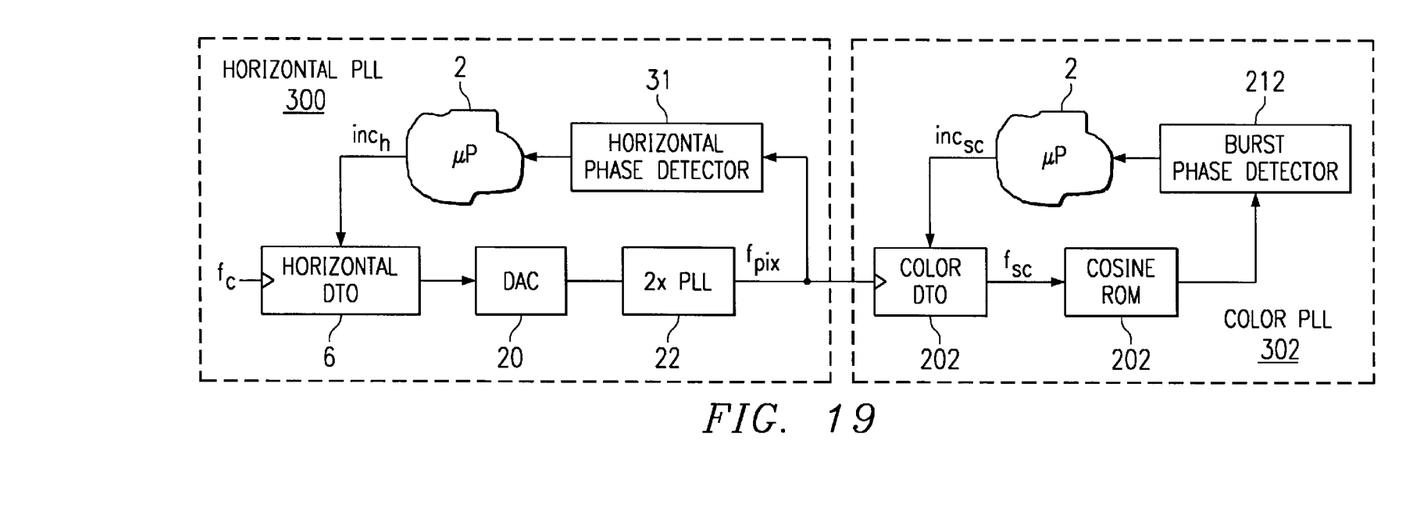
FIG. 19 is a block diagram which illustrates the horizontal phase-locked loop and the color phase-locked loops.

FIG. 19 is a block diagram which illustrates the horizontal phase-locked loop, indicated generally by block 300, and the color phase-locked loops, indicated generally at block 302. Horizontal DTO 6 is clocked by the crystal clock frequency $f_c$. Horizontal phase-locked loop 300 generates the pixel clock frequency $f_{pix}$. Color phase-locked loop 302 converts the $f_{pix}$ frequency it receives from horizontal phase-locked loop 300 to the color subcarrier frequency $f_{sc}$. The ratio of pixel clock frequency $f_{pix}$ to the crystal clock frequency $f_c$ is a function of the number of bits (24 bits) in the horizontal DTO, the 2×PLL factor and the horizontal DTO increment, hereinafter referenced by $inc_h$, that is computed by the microprocessor as a function of the horizontal phase error. This relationship is further demonstrated at equation (22).

$$f_{pix}/f_c = 2 * inc_h / 2^{24} = inc_h / 2^{23} \tag{22}$$

Similarly, the ratio of the color subcarrier frequency to pixel clock frequency is a function of increment $inc_{sc}$ computed by microprocessor 2 as a function of the burst phase error and the number of bits (24 bits) in the color DTO. This relationship is shown in equation (23).

$$f_{sc}/f_{pix} = inc_{sc}/2^{24} \tag{23}$$

The product of the two ratios in equation (23) yields a ratio which should be a constant if the nominal color subcarrier frequency is to be maintained independent of variations in pixel clock frequency. This ratio is shown in equation (24).

$$f_{sc}/f_c = inc_h * inc_{sc}/2^{47} = \text{constant} \tag{24}$$

By assuming $f_{sc}$ as being substantially constant as indicated by $f_{nom\ sc}$, the feed forward error from the horizontal PLL can be determined. The feed forward error is the increment error transmitted from the horizontal DTO increment to the color DTO increment. The feed forward error is generally referenced as the variation between the nominal horizontal DTO increment (hereinafter referenced as nom $inc_h$) and the actual horizontal DTO increment $inc_h$, e.g.

$$inc_h = \text{nom } inc_h + \Delta_h. \tag{25}$$

The nominal horizontal DTO increment nom $inc_h$ for various standards is displayed in hexadecimal in table 1. Changes in the horizontal DTO increment are therefore compensated by changes in the color DTO increment, $inc_{sc}$, since $f_{nom\ sc}$ is constant. The frequency ratio is therefore constant and $$f_{nom\ sc}/f_c = inc_h * inc_{sc}/2^{47} = \text{constant} \tag{26}$$

and $$inc_{sc} = f_{nom\ sc}/f_c * 2^{47}/inc_h. \tag{27}$$

Substituting for $inc_h$ as expressed in equation (25) into equation (27) yields the following:

$$inc_{sc} = f_{nom\ sc}/f_c * 2^{47}/(nom\ inc_h + \Delta_h) \quad (28)$$

which can be rewritten as $$inc_{sc} = f_{nom\ sc}/f_c * 2^{47}/[(1+\Delta_h/nom\ inc_h)*nom\ inc_h] \quad (29)$$

The nominal horizontal increment is a function of the frequency ratio as expressed in equation (30).

$$nom\ inc_h = 2^{23} * nominal\ f_{pix}/f_c. \quad (20)$$

Substitution of equation (30) into equation (29) yields equation (31).

$$inc_{sc} = f_{nom\ sc}/nominal\ f_{pix} * 2^{24}/(1+\Delta_h/nom\ inc_h) \quad (31)$$

Substitution for the frequency ratio yields a result for the color subcarrier increment which is a function of the nominal DTO increments and the delta (change) variation in the horizontal in the horizontal DTO increment. This is expressed in equation (32).

$$inc_{sc} = nom\ inc_{sc}/(1+\Delta_h/nom\ inc_h). \quad (32)$$

Equation (32) illustrates the expected inverse relationship between the delta variation in horizontal DTO increment and the variation in the color DTO increment. When the horizontal phase-locked loop is in the coarse lock mode of operation, the $\Delta_h$ variations are quantized to a fixed set of values based on a difference between a pixel counter value saved after a horizontal sync has been detected and the expected value for the saved value. Thus, a lookup table can be used to determine the value for $inc_{sc}$. During fine lock, a Taylor's series expansion can be used to approximate the value as follows:

$$inc_{sc} \approx nom\ inc_{sc} * (1-\Delta_h/nom\ inc_h) \approx nom\ inc_{sc}/nom\ inc_h \quad (33)$$

The ratio of nominal increments can be approximated by fractions made up of negative powers of twos and it can be applied to the $\Delta_h$ value to obtain $inc_{sc}$ as shown in table 4.

| SAMPLING RATE | NTSC | PAL | PAL M | PAL N |
|---|---|---|---|---|
| square pixel | 0.11110110 | 1.01000101 | 0.11110111 | 0.11100001 |
| CCIR601 | 1.01000110 | 0.11110111 | 1.00010111 | 1.00110010 |

Figure 20:
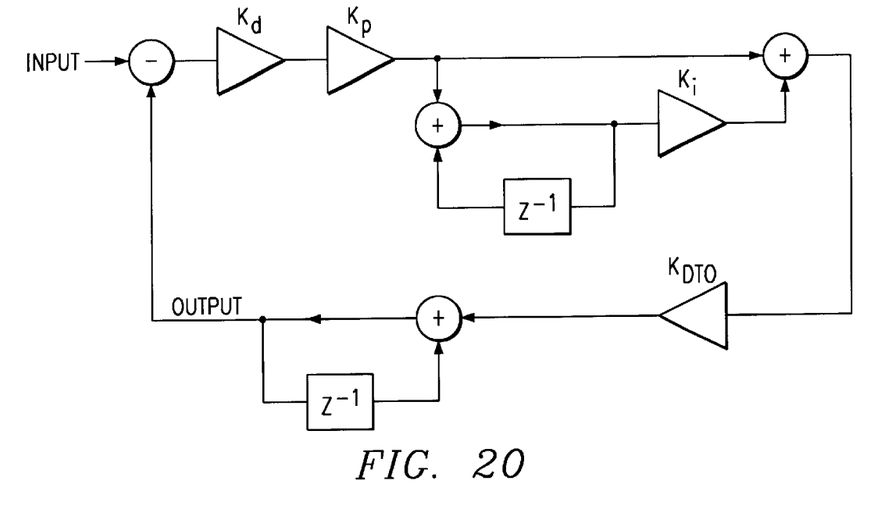
FIG. 20 shows a block diagram illustrative of the response of the phase-locked loop according to the invention.

FIG. 20 shows a block diagram illustrative of the response of the phase-locked loop according to the invention. The input corresponds to a phase and there are two accumulator blocks and one line delay block labeled $Z^{-1}$ as well as four gain blocks with gains labeled K with appropriate subscripts. $K_d$ is the phase detector gain in units of LSBs per degree, $K_p$ is a proportional gain applied to the phase error. $K_i$ is an integral gain applied to the phase error accumulator and $K_{DTO}$ is the DTO gain in units of degrees per least significant bit (LSB). $K_{DTO}$ is computed as the phase shift in degrees generated by one LSB change in the color DTO increment for one line. The gains are defined for the NTSC standard at the square pixel sampling rate by the equations below, wherein the amplitude of the color burst signal is represented as "burst amp," and the gain is that applied by the color demodulator and low pass filter.

Figure 21:
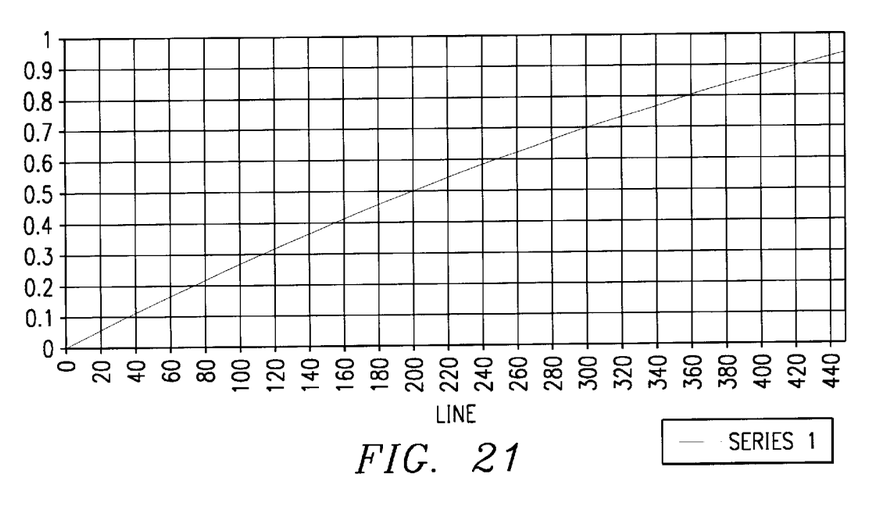
FIG. 21 illustrates the response to the loop to a step change in the input for the NTSC standard at the square pixel sampling rate.

(34) $K_d$ = burst amp*gain/90° *360°/$f_{pix}/f_{sc}$)LSB/pixel
     =32*15/90*360/(24/7)
     =560 LSB/pixel
(35) $K_p$ = 1/32
(36) $K_i$ = 1/32*1/512
     =1/16384
(37) $\Delta = f_{pix}/2^{24}$ Hz/LSB
(38) $K_{DTO} = 455/2*[1/f_{sc} - 1/(f_{sc} + \Delta)]*f_{pix}$ pixel/LSB
     =0.000159 pixel/LSB FIG. 21 illustrates the response to the loop to a step change in the input for the NTSC standard at the square pixel sampling rate Although the invention has been described in detail herein with reference to its preferred embodiment, it is to be understood that this description is by way of example only, and is not to be construed in a limiting sense. It is to be further understood that numerous changes in the details of the embodiments of the invention, and additional embodiments of the invention, will be apparent to, and may be made by persons of ordinary skill in the art having reference to this description. It is contemplated that all such changes and additional embodiments are within the true scope and spirit of the invention as claimed below.

We claim:

1. A color phase-locked loop comprising:

a read only memory, said read only memory being operable to output data corresponding to information stored in a look-up table;

a color demodulator, said color demodulator including a multiplier which is operable to multiply composite video pixels by samples from the output of said read only memory;

a low pass filter, said low pass filter being operable to filter the product of said multiplier in said color demodulator;

a data register, said data register being operable to store color burst phase data and the filtered output of said low pass filter, said data register being further operable to output color burst phase error data;

a microprocessor responsive to a quantized limited delta correction signal, a feed forward error signal to compensate for changes in horizontal DTO frequency during fine lock, a nominal color DTO increment signal, and said color burst phase error data to output a color DTO increment signal;

a color discrete time oscillator responsive to said color DTO increment signal to increment address information to said look-up table.

* * * * *